(12) United States Patent
Muramoto et al.

(10) Patent No.: US 10,749,313 B2
(45) Date of Patent: Aug. 18, 2020

(54) METHOD FOR MANUFACTURING A SEMICONDUCTOR ELEMENT

(71) Applicant: NICHIA CORPORATION, Anan-shi, Tokushima (JP)

(72) Inventors: Eiji Muramoto, Tokushima (JP); Akinori Kishi, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 16/453,328

(22) Filed: Jun. 26, 2019

(65) Prior Publication Data
US 2020/0006914 A1 Jan. 2, 2020

(30) Foreign Application Priority Data

Jun. 29, 2018 (JP) .................. 2018-124850

(51) Int. Cl.
| | | |
|---|---|---|
| *H01S 5/02* | (2006.01) | |
| *H01S 5/028* | (2006.01) | |
| *H01L 33/00* | (2010.01) | |
| *H01L 33/06* | (2010.01) | |
| *H01L 33/22* | (2010.01) | |
| *H01L 33/32* | (2010.01) | |
| *H01L 33/38* | (2010.01) | |
| *H01S 5/042* | (2006.01) | |

(Continued)

(52) U.S. Cl.
CPC ............ *H01S 5/028* (2013.01); *H01L 33/007* (2013.01); *H01L 33/0095* (2013.01); *H01L 33/06* (2013.01); *H01L 33/22* (2013.01); *H01L 33/32* (2013.01); *H01L 33/38* (2013.01); *H01L 33/44* (2013.01); *H01S 5/0201* (2013.01); *H01S 5/0425* (2013.01); *H01S 5/34333* (2013.01); *H01L 2933/0016* (2013.01); *H01L 2933/0025* (2013.01); *H01S 2304/04* (2013.01)

(58) Field of Classification Search
CPC ... H01S 5/028; H01L 33/0095; H01L 33/007; H01L 21/8258
See application file for complete search history.

(56) References Cited

U.S. PATENT DOCUMENTS

| | | | |
|---|---|---|---|
| 2014/0110738 A1 | 4/2014 | Yokobayashi et al. | |
| 2014/0264364 A1* | 9/2014 | Kanamura | H01L 29/513 257/76 |
| 2016/0064603 A1 | 3/2016 | Lin et al. | |

FOREIGN PATENT DOCUMENTS

| | | |
|---|---|---|
| JP | 2014-086574 A | 5/2014 |
| JP | 2016-046511 A | 4/2016 |
| JP | 2017-069282 A | 4/2017 |

* cited by examiner

*Primary Examiner* — William Coleman
(74) *Attorney, Agent, or Firm* — Global IP Counselors, LLP

(57) ABSTRACT

A method for manufacturing a semiconductor element includes: providing a nitride semiconductor layer; performing plasma treatment to at least part of a surface of the nitride semiconductor layer in an oxygen-containing atmosphere while applying bias power; after the performing of the plasma treatment, heat treating the nitride semiconductor layer in an oxygen-containing atmosphere; forming a protective film on a region of the surface of the nitride semiconductor layer where the plasma treatment was performed; and forming an electrode in a region of the surface of the nitride semiconductor layer where the protective film was not formed.

18 Claims, 9 Drawing Sheets

(51) Int. Cl.
*H01S 5/343* (2006.01)
*H01L 33/44* (2010.01)

METHOD FOR MANUFACTURING A SEMICONDUCTOR ELEMENT

CROSS-REFERENCE TO RELATED APPLICATION

This application claims priority to Japanese Patent Application No. 2018-124850, filed on Jun. 29, 2018, the disclosure of which is hereby incorporated by reference in its entirety.

BACKGROUND

The present invention relates to a method for manufacturing a semiconductor element.

A semiconductor light emitting element, which is an example of a semiconductor element, is formed by stacking a semiconductor layer over a growth substrate.

With semiconductor light emitting elements, a device is needed with which high luminance and high luminous efficiency are realized, and a material with high reflectivity is used to further improve the light extracting efficiency (see, for example, Japanese Patent Publication No. 2014-86574 and Japanese Patent Publication No. 2017-69282).

SUMMARY

With a semiconductor element in which a nitride semiconductor is used, interface leakage of current may occur at the interface between the nitride semiconductor and the protective film (insulating film or the like), regardless of whether or not a large current is applied. This interface leakage can be caused by various factors, such as the type of protective film, the conditions under which the semiconductor elements are separated, and the output of laser light during chip formation.

The present disclosure has been made in view of such circumstances, and an object of the present application is to provide a method for manufacturing a semiconductor element with which the occurrence of leakage current, in particular, caused by the various causes mentioned above can be effectively prevented.

A method for manufacturing a semiconductor element includes: providing a nitride semiconductor layer; performing plasma treatment to at least part of a surface of the nitride semiconductor layer in an oxygen-containing atmosphere while applying bias power; after the performing of the plasma treatment, heat treating the nitride semiconductor layer in an oxygen-containing atmosphere; forming a protective film on a region of the surface of the nitride semiconductor layer where the plasma treatment was performed; and forming an electrode in a region of the surface of the nitride semiconductor layer where the protective film was not formed.

DETAILED DESCRIPTION OF THE INVENTION

Figure 1A:
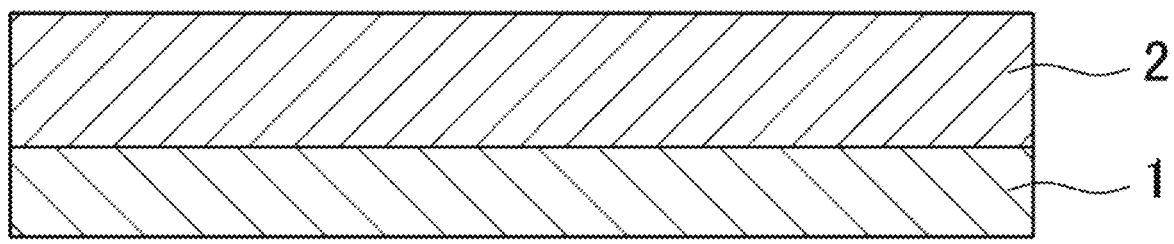
FIGS. 1A to 1D are simplified cross sectional step diagrams showing the method for manufacturing a semiconductor element of Embodiment 1 according to the present disclosure.

Hereinafter, embodiments of the present disclosure will be described with reference to the drawings as appropriate. However, a method for manufacturing a semiconductor element described below is intended to embody the technical idea of the present disclosure, and the present disclosure is not limited to the following embodiments unless otherwise specified. In addition, the matters described in one embodiment or example are applicable to other embodiments or examples.

The size, the positional relation and the like of the members shown in the drawings may be exaggerated for clarification of explanation.

Embodiment 1

Figure 1B:
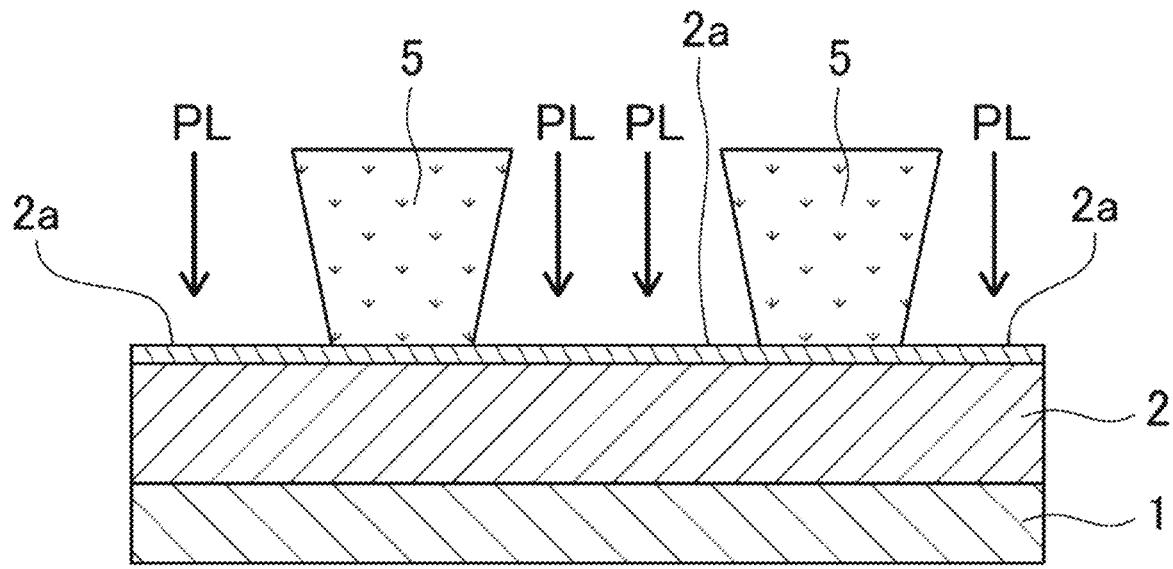
Figure 1C:
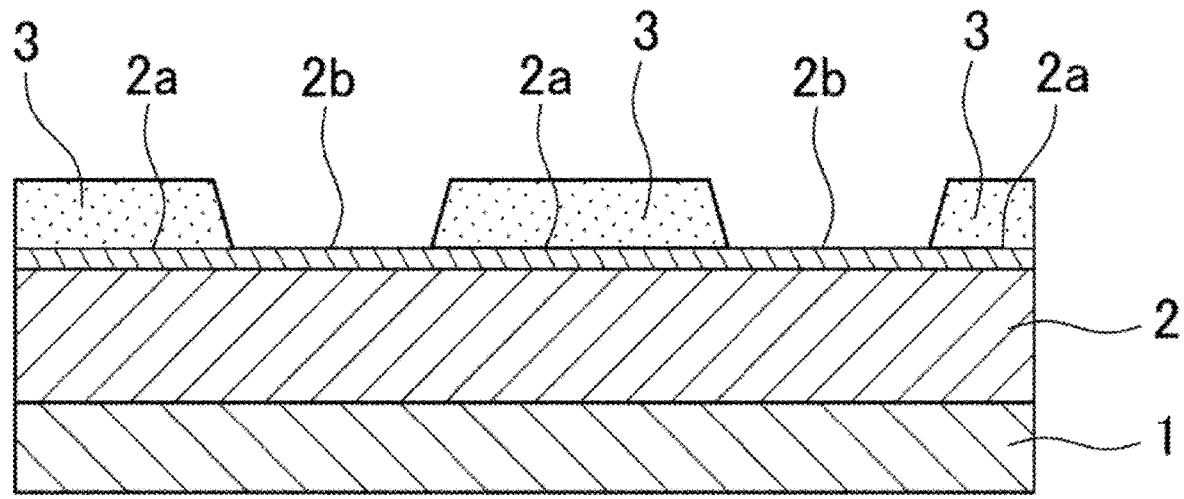
Figure 1D:
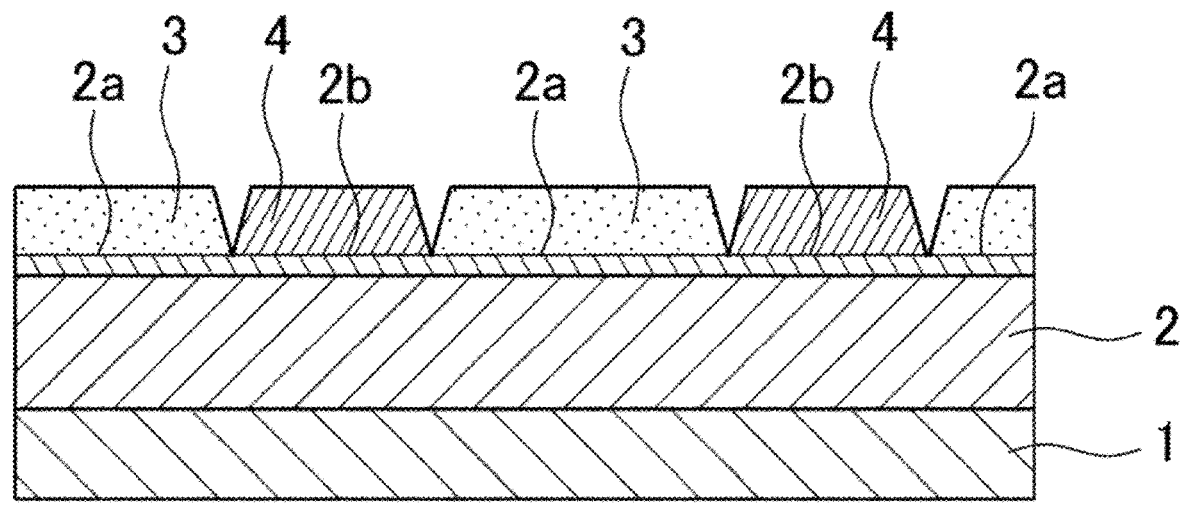

As shown in FIGS. 1A to 1D, the method for manufacturing a semiconductor element in this embodiment has the steps of:

forming a nitride semiconductor layer 2 on a substrate 1 (FIG. 1A), performing plasma treatment to at least part of the surface of the nitride semiconductor layer 2 in an oxygen-containing atmosphere while applying bias power (FIG. 1B), then heat treating the nitride semiconductor layer 2 in an oxygen-containing atmosphere, forming a protective film 3 in the region 2a of the surface of the nitride semiconductor layer where the plasma treatment has been performed (FIG. 1C), and forming an electrode 4 in the region 2b of the surface of the nitride semiconductor layer where the plasma treatment has not been performed and the protective film has not been formed (FIG. 1D).

In prior art, a plasma treatment was performed on the semiconductor layer in order to avoid leakage current between the surface of the semiconductor layer and the protective film, but even though a plasma treatment was performed, resistance on the surface of the semiconductor layer could not be raised high enough, so the effect was inadequate. In particular, in the case where laser light is used as a processing means for dicing into semiconductor elements having a nitride semiconductor layer, the semiconductor layer is prone to being damaged by the heat produced by the laser beam used for dicing or the like, an interface state is generated at the interface portion between the semiconductor layer and the protective film, and leakage current can not be suppressed.

On the other hand, as mentioned above, it is possible to increase the resistance in the area near the surface of the plasma-treated nitride semiconductor layer by performing a plasma treatment while applying bias power and then performing heat treatment in an oxygen-containing atmosphere. As a result, the occurrence of leakage current at the interface between the nitride semiconductor layer and the protective film can be effectively suppressed. Not only in the case where a plasma treatment is performed while bias power is applied, but also by further adding heat treatment to the plasma treatment region, the oxygen atoms adhering to the surface of the nitride semiconductor layer can be incorporated into the crystals of the nitride semiconductor layer, and the resistance of the surface of the nitride semiconductor layer can be increased more effectively. With a method such as this, it is possible to reliably prevent leakage current at the interface between the nitride semiconductor layer and the protective layer, regardless of the type of protective film. Also, a leakage suppression effect at the interface between the nitride semiconductor layer and the protective film can be obtained reliably even by irradiating the dividing lines of the semiconductor elements with a laser beam for dicing the substrate on which the semiconductor layer is formed after plasma treatment and heat treatment. As a result, it is possible to divide the nitride semiconductor layer by laser processing, so the distance between elements can be shorter than when the layer is divided by using a dicing blade or the like, so manufacturing costs and the like can be reduced, and the reliability of the semiconductor element can be improved.

Formation of Semiconductor Layer

First, a nitride semiconductor layer 2 is provided as shown in FIG. 1A.

The nitride semiconductor layer 2 may have a single-layer structure, but in order to form a semiconductor element, and in particular a semiconductor light emitting element such as an LED or a laser, a multilayer stacked structure having an n-side semiconductor layer, an active layer and a p-side semiconductor layer is preferable. The n-side semiconductor layer and the p-side semiconductor layer may respectively include an n-type semiconductor layer and a p-type semiconductor layer, and some of the layers may be undoped. In addition, all of these layers may be either a single layer or a stacked structure. The active layer has, for example, a multiple quantum well structure or a single quantum well structure. An example of the material constituting the nitride semiconductor layer is a nitride semiconductor, such as $In_xAl_yGa_{1-x-y}N$, where $0 \leq x$, $0 \leq y$, $x+y \leq 1$.

The nitride semiconductor layer can be formed on the substrate 1 by any method known in this field, such as MOCVD, by means of epitaxial growth. This substrate may be any one on which a nitride semiconductor layer can be formed in this field, examples of which include a GaN substrate, a GaAs substrate, and other such compound semiconductor substrates, a silicon substrate and other such element semiconductor substrates, and a sapphire substrate and other such insulating substrate.

The thickness of these nitride semiconductor layers can be appropriately adjusted, so long as they function as a semiconductor element.

Plasma Treatment

As shown in FIG. 1B, a plasma treatment PL is performed on at least part of the surface of the nitride semiconductor layer 2, in an oxygen-containing atmosphere, while bias power is applied. An inert gas such as argon or nitrogen may be contained in the atmosphere during the plasma treatment in addition to oxygen. The surface of the nitride semiconductor layer 2 may be either an n-type semiconductor layer, a p-type semiconductor layer, or an undoped semiconductor layer. This is because a plasma treatment performed while bias power is applied introduces more oxygen than a plasma treatment in which no bias power is applied to the surface of the nitride semiconductor layer 2, thereby increasing the resistance of the surface of the nitride semiconductor layer 2.

The plasma treatment can be performed using any plasma treatment device known in this field. The plasma treatment is performed while bias power is applied. The bias power here is preferably set within a range of 50W to 400 W. Thus setting the bias power allows oxygen to be more reliably introduced to the surface of the nitride semiconductor layer 2.

The plasma treatment can be carried out, for example, for between 1 second and 10 minutes, and is preferably performed for between 30 seconds and 3 minutes.

The plasma treatment may be performed on the entire surface of the nitride semiconductor layer, but it must be performed at least part of the surface. In this case, for example, as shown in FIG. 13B, plasma treatment is preferably performed in a state in which the surface of the nitride semiconductor layer 2 that is not to be subjected to plasma treatment is covered with a mask 5. This method allows the plasma treatment to be performed only in a specific region. The mask here can be formed in the desired pattern using a resist composition, an insulating film, or the like that is used in this field, using photolithography and etching steps, for example.

Heat Treatment

After performing the above-mentioned plasma treatment, the nitride semiconductor layer 2 is heat treated in an oxygen-containing atmosphere.

The oxygen-containing atmosphere here may be any atmosphere whose oxygen content is 80% or less (based on volume), preferably 50% or less, or 30% or less, more preferably 10% or less, or 5% or less, and even more preferably 0.01% to 2.0%. Setting the oxygen content to 80% or less suppresses migration and oxidation of the electrodes provided on the surface of the nitride semiconductor layer 2. Keeping the oxygen content to at least 0.01% allows oxygen to be introduced into the nitride semiconductor layer 2. Keeping the oxygen content to 2.0% or less further suppresses migration and oxidation of the electrodes provided on the surface of the nitride semiconductor layer 2.

The heat treatment is preferably performed in an atmosphere at 600° C. or lower, more preferably at 500° C. or lower, and even more preferably at 350° C. to 500° C., for example.

The duration of the heat treatment can be appropriately adjusted depending on the oxygen content in the oxygen atmosphere, the temperature, and so forth. For instance, a duration of 1 minute to 60 minutes is preferable, and 5 minutes to 30 minutes is more preferable.

Formation of Protective Film

As shown in FIG. 1C, the protective film 3 is formed on the entire surface of the nitride semiconductor layer 2, or in the region 2a where plasma treatment has been performed.

Examples of the protective film 3 include oxides, nitrides, oxynitrides, and so forth of Zr, Si, V, Nb, Hf, Ta, Al, Ce, In, Sb, Zn and the like. It is preferable for the refractive index difference between the protective film and the nitride semiconductor layer (such as GaN) to be large. An example of such a material is $SiO_2$. The film thickness may be about 100 nm to 1500 nm, for example.

Formation of Electrodes

As shown in FIG. 1D, the electrodes 4 are formed in the region 2b of the surface of the nitride semiconductor layer 2 where plasma treatment has not been performed, and in all or part of the region where the protective film 3 has not been formed.

The electrodes can be formed, for example, by a single layer film or a stacked film of palladium, platinum, nickel, gold, titanium, tungsten, copper, silver, zinc, tin, indium, chromium, aluminum, iridium, rhodium or another such metal or alloy. The film thickness of the electrodes is, for example, 10 nm to 1000 nm, and preferably 100 nm to 1000 nm.

In the above method for manufacturing a semiconductor element, the surface of the nitride semiconductor layer 2 includes a region where gallium and oxygen are bonded and/or a region where gallium and nitrogen are bonded, regardless of whether or not a plasma treatment is performed. The region where gallium and oxygen are bonded and/or the region where gallium and nitrogen are bonded can be measured by X-ray photoelectron spectroscopy (XPS) or electron spectroscopy for chemical analysis (ESCA), and both of them can be measured using a commercially available device. The phrase "surface of the nitride semiconductor layer" here refers not only to the outermost surface of the nitride semiconductor layer, but also to the region to a depth of a few nanometers (e.g., 2 nm or 3 nm) of the nitride semiconductor. This is because, with an XPS apparatus using Al-Kα rays, for example; constituent elements of a sample and the electronic state thereof can be analyzed by irradiating the sample surface with X rays and measuring the energy of photoelectrons generated, and it is generally possible to measure information about the elements present at a depth of a few nanometers from the sample surface.

Also, the surface of the nitride semiconductor layer includes the bonding of gallium and oxygen and/or the bonding of gallium and nitrogen after plasma treatment, after heat treatment in the oxygen-containing atmosphere following the plasma treatment, and/or after the subsequent formation of the protective film.

As described above, the area of the surface of the nitride semiconductor layer in which gallium and oxygen are bonded after plasma treatment, after heat treatment in the oxygen-containing atmosphere following the plasma treatment, and/or after the subsequent formation of the protective film is larger than that of the nitride semiconductor layer that has not undergone plasma treatment. For example, the area is preferably at least 10% more, and more preferably at least 15% more, with respect to the area of the surface where gallium and oxygen are bonded on the surface of the nitride semiconductor layer that has not yet undergone the plasma treatment.

Also, the surface of the nitride semiconductor layer which has been heat treated in the oxygen-containing atmosphere after plasma treatment while bias power is applied is preferably such that the region where gallium and oxygen are bonded accounts for at least 70%, and more preferably at least 75% among the region where gallium and oxygen are bonded and where gallium and nitrogen are bonded.

Embodiment 2

Figure 2A:
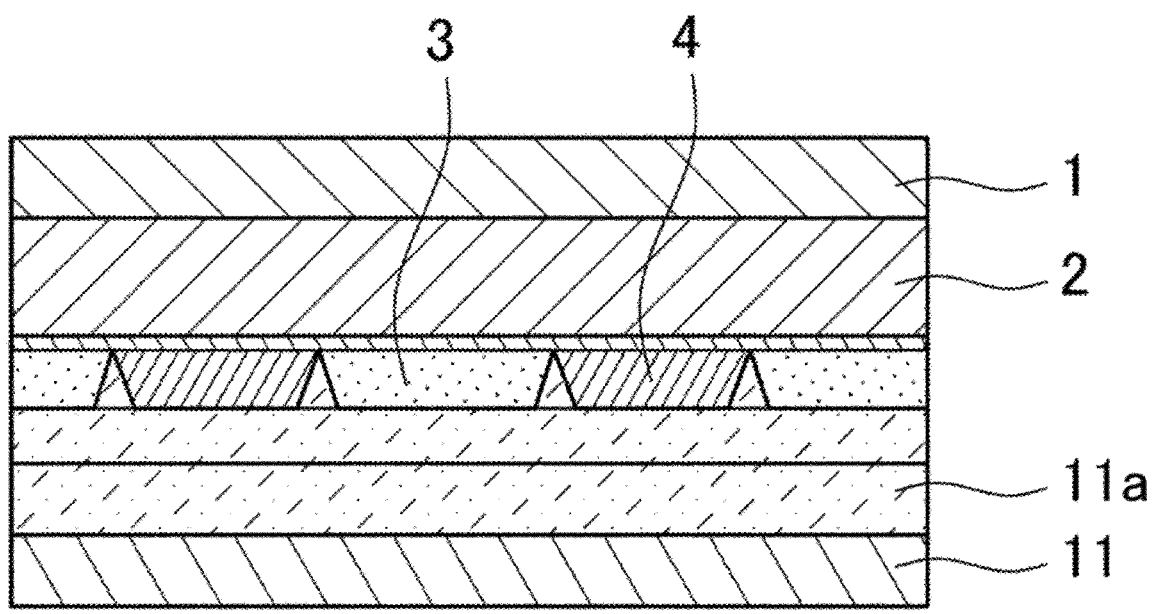
FIGS. 2A to 2D are simplified cross sectional step diagrams showing the method for manufacturing a semiconductor element of Embodiment 2 according to the present disclosure.
Figure 2B:
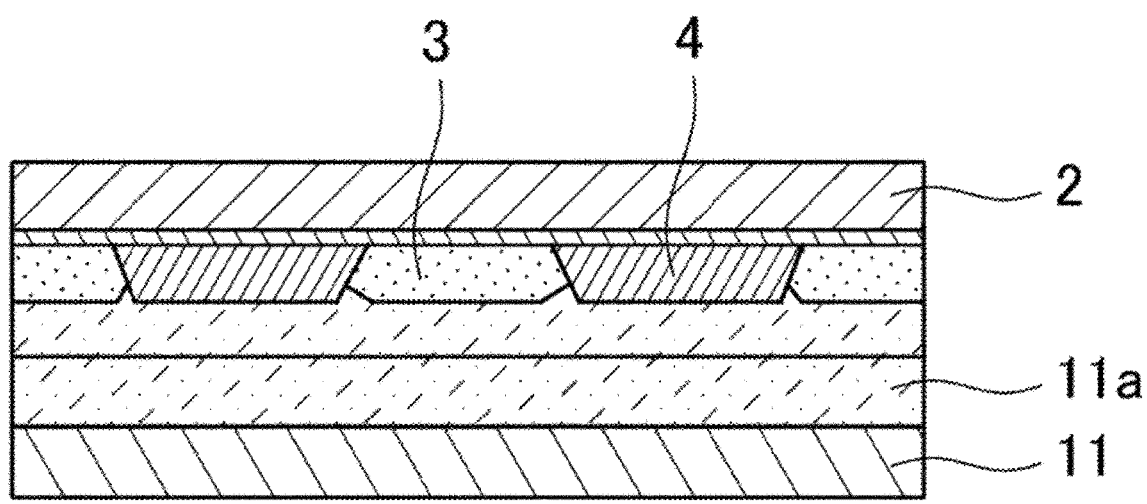
Figure 2C:
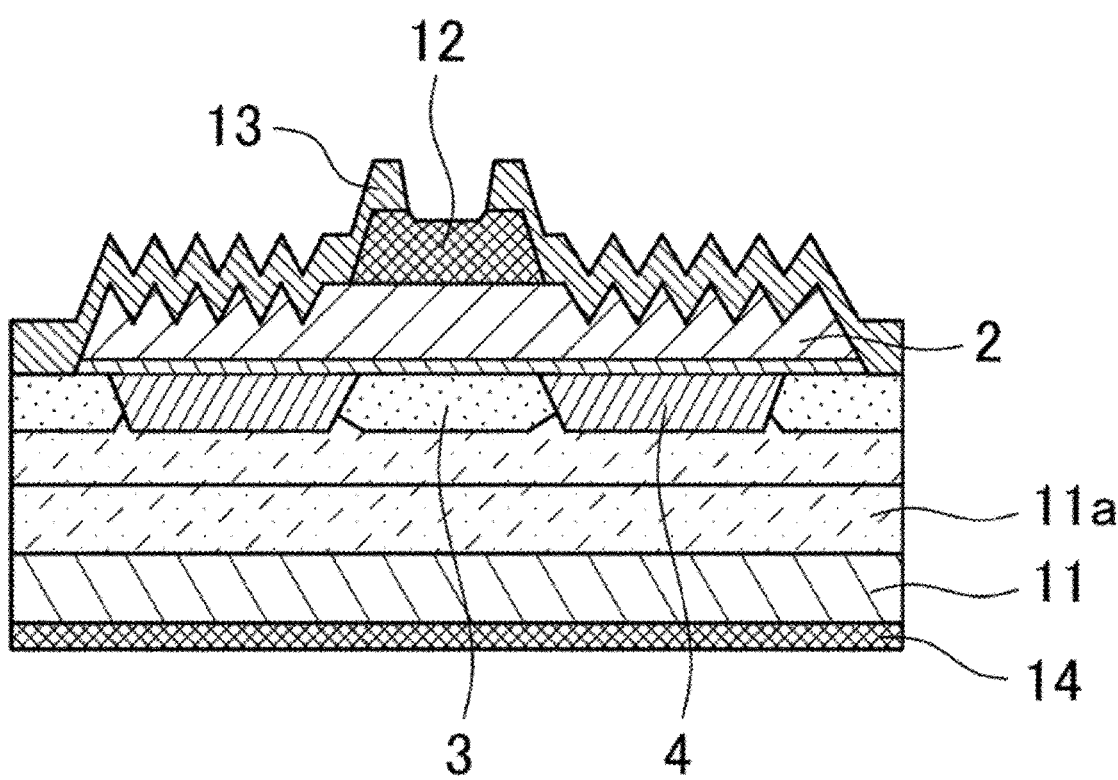
Figure 2D:
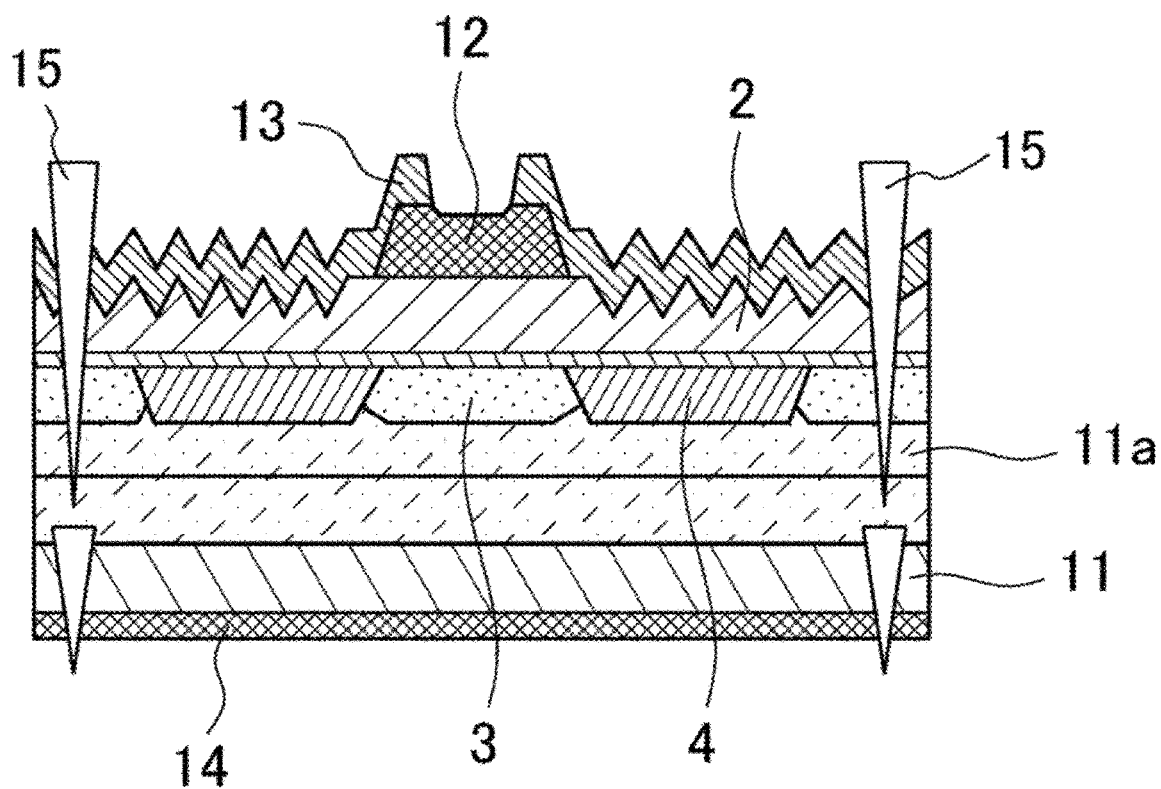

The method for manufacturing a semiconductor element in this embodiment can be used to manufacture a semiconductor element using a support substrate. For example, after the steps shown in FIGS. 1A to 1D described above, this method further includes, as shown in FIGS. 2A to 2D, the steps of:

providing a support substrate 11 (support member) (FIG. 2A);

stacking the electrode 4 and the protective film 3 on the surface of the nitride semiconductor layer 2 to the support substrate 11 (FIG. 2A);

removing the substrate 1 to expose the back surface of the nitride semiconductor layer 2 (FIG. 2B);

forming a lower electrode 12 on the back surface of the nitride semiconductor layer 2, and forming a protective film 13 that exposes part of this lower electrode 12 (FIG. 2C); and dicing the support substrate 11 to obtain semiconductor elements (FIG. 2D).

Preparation of Support Substrate

The support substrate 11 is provided as shown in FIG. 2A.

Examples of the support substrate 11 include a silicon substrate and a CuW substrate. In terms of manufacturing semiconductor elements at low cost, it is preferable to use a silicon substrate for the support substrate 11.

The support substrate 11 preferably has a bonding layer 11a on the surface facing the nitride semiconductor layer 2. The bonding layer 11a can be formed, for example, by a single layer film or a stacked film of palladium, platinum, nickel, gold, titanium, tungsten, copper, silver, zinc, tin, indium, chromium, aluminum, iridium, rhodium or another such metal or alloy. The film thickness of the bonding layer 11a is, for example, 300 μm to 5 nm, and preferably 300 μm to 500 μm.

Bonding of Support Substrate

As shown in FIG. 2A, the electrode 4 and the protective film 3 on the surface of the nitride semiconductor layer 2 are bonded to the support substrate 11. That is, they can be bonded by being connected such that the electrode 4 on the surface of the nitride semiconductor layer 2 faces the bonding layer 11a of the support substrate 11.

The bonding method here can be solid phase diffusion bonding, liquid phase diffusion bonding, heat pressure welding, or the like.

Exposure of Back Surface of Nitride Semiconductor Layer

As shown in FIG. 2B, at least part of the substrate 1 is removed from underneath to expose the back surface of the nitride semiconductor layer 2. Here, the nitride semiconductor layer 2 itself may be made into a thin film. Since the support substrate 11 is banded, the strength of the nitride semiconductor layer 2 can be ensured even after such thinning. The removal of the substrate 1 preferably involves the use of laser lift-off, polishing, dry etching, wet etching, or the like. The substrate removing step here need not completely remove the substrate, and the substrate 1 may be left on the nitride semiconductor layer 2.

Also, the nitride semiconductor layer 2 may be patterned on the support substrate 11 so as to have the desired planar shape, or its surface may be processed to have a textured shape. In order to improve the light extracting efficiency of the light emitting element, it is preferable for the height difference in this textured shape to be between 0.2 μm and 3.0 μm, and more preferably 0.4 μm and 1.5 μm.

Formation of Lower Electrode and Protective Film

The lower electrode 12 is preferably formed on the back surface of the nitride semiconductor layer 2 after exposing the back surface of the nitride semiconductor layer 2 or making the substrate 1 into a thin film, as shown in FIG. 2C. The lower electrode 12 may have the same material and/or stacked structure as the above-mentioned electrode 4, or may have a different material and/or stacked structure. The film thickness of the lower electrode 12 can be appropriately set depending on the material to be used and so forth. For instance, the lower electrode 12 can be formed, for example, by a single layer film or a stacked film of palladium, platinum, nickel, gold, titanium, tungsten, copper, silver, zinc, tin, indium, chromium, aluminum, iridium, rhodium or another such metal or alloy. The lower electrode 12 can have a stacked structure in which titanium, platinum, and gold are stacked in that order starting from the surface of the nitride semiconductor layer. The film thickness of the lower electrode 12 is, for example, 100 nm to 5 µm.

In the case where the substrate 1 has been completely removed, the lower electrode 12 can be formed on the surface of the nitride semiconductor layer 2 on the opposite side from the support substrate 11. The lower electrode 12 is preferably provided, for example, at a position not overlapping the electrode 4 in the thickness direction of the nitride semiconductor layer 2. This makes it easier for the current supplied from the lower electrode 12 to diffuse in the planar direction of the nitride semiconductor layer.

If necessary, the support substrate 11 may be thinned to the desired thickness. This thinning of the support substrate 11 can facilitate dicing of the nitride semiconductor layer or the like in a later step. However, in the case where the support substrate 11 is made too thin, it will be difficult to handle, so it is preferably only thinned to an extent that still allows adequate strength to be ensured.

It is preferable to form the protective film 13 on the nitride semiconductor layer 2 and on the lower electrode 12 formed on the back surface of the nitride semiconductor layer 2. The protective film 13 formed on the lower electrode 12 can be formed from the same material as the protective film 3 formed in the above-mentioned region 2a of the nitride semiconductor layer 2 where the plasma treatment is performed. It is preferable to use a material having an insulating property as the protective film 13. In this case, it is preferable to form the protective film 13 in a state in which part of the surface of the lower electrode 12 is exposed for electrical connection.

A third electrode 14 may be formed as needed on the back surface of the support substrate 11 (the surface on the opposite side from the nitride semiconductor layer 2). This third electrode 14 may have the same or different material and/or stacked structure as the electrode 4 and the lower electrode 12. An alloy layer containing tin, such as gold tin or silver tin, can be used for the third electrode 14.

Division into Semiconductor Element

The support substrate 11 is divided, e.g., diced, as shown in FIG. 2D. This yields semiconductor elements.

In this division, in the case where the semiconductor elements are laser elements, the process includes division for forming the resonator end surface (division in the X direction) and division in a direction intersection the resonator end surface (division in the Y direction). The division in either the X direction or the Y direction may be performed first. It is preferable to divide along the X direction and the Y direction perpendicular to the X direction in the case where the semiconductor elements are LEDs.

For example, as shown in FIG. 2D, the protective films 3 and 13, the bonding layer 11a, and the like provided at positions that are divided on the upper surface of the support substrate 11 are removed by being irradiated with a laser beam 15. After this, the support substrate 11 at the positions where the protective films 3 and 13 and the bonding layer 11a were removed is divided into individual pieces by using a dicing blade or a laser beam. Performing these steps in the X direction and the Y direction yields individual support substrates 11. The bonding layer 11a need not be completely removed when removing the protective films 3 and 13 and the bonding layer 11a.

Evaluation Experiment 1: Blue Light

Formation of Semiconductor Layer

A stacked structure of a nitride semiconductor 2 capable of constituting an LED that emits blue light was formed on a substrate 1 made of sapphire. The stacked structure of the nitride semiconductor 2 was produced by forming an n-side nitride semiconductor layer (such as a layer having a thickness of 11 µm and including a GaN layer doped with silicon as an impurity), a light emitting layer (such as a layer having a total thickness of 140 nm and having a multiple quantum well structure formed by a GaN layer and an InGaN layer), and a p-side nitride semiconductor (such as a layer having a thickness of 120 nm and including a GaN layer doped with magnesium as an impurity), in that order, on a substrate. After this, heat treatment for diffusing the p-type impurity into the nitride semiconductor layer was performed in an oxygen-containing atmosphere at 550° C. for 10 minutes.

After this heat treatment, a plurality of p-side electrodes of a specific shape were formed on the p-side nitride semiconductor layer. The p-side electrodes were formed by a stacked structure having a total thickness of 670 µm and in which silver, nickel, titanium, and platinum were stacked in that order.

Figure 3A:
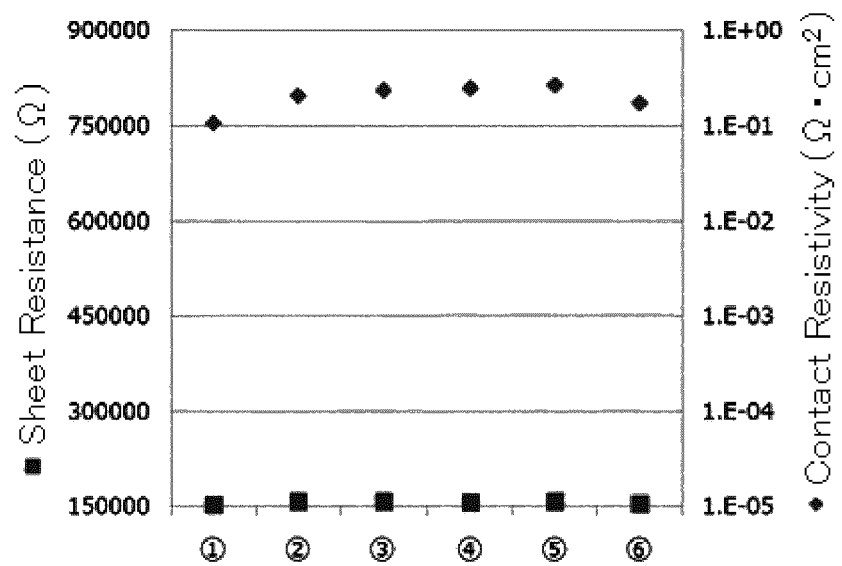
FIGS. 3A to 3E are graphs of the evaluation results for sheet resistance and contact resistance of a semiconductor element featuring a nitride semiconductor layer that emits blue light, and a semiconductor element featuring a comparative nitride semiconductor layer.
Figure 3B:
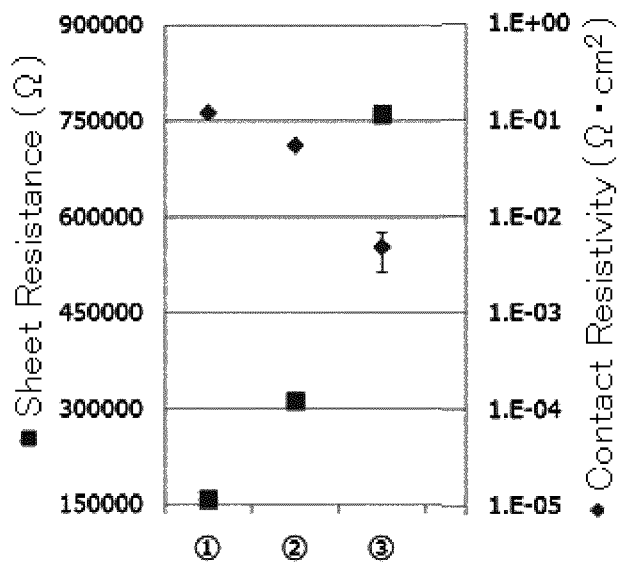
Figure 3C:
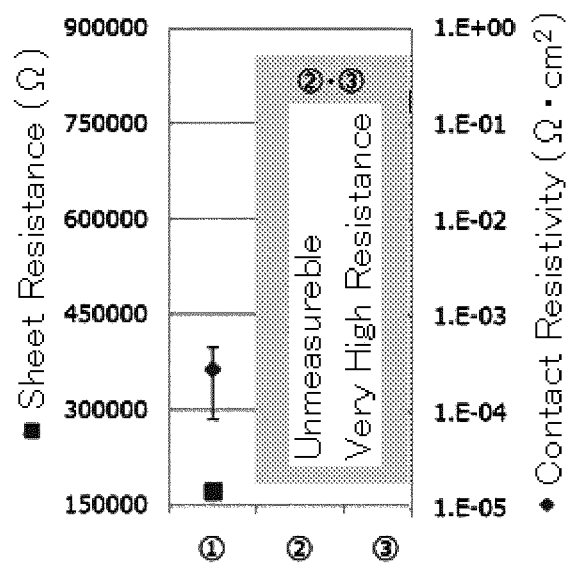
Figure 3D:
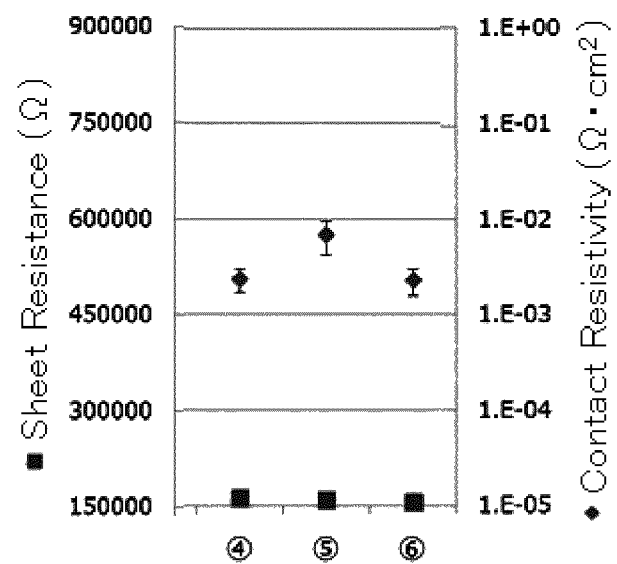
Figure 3E:
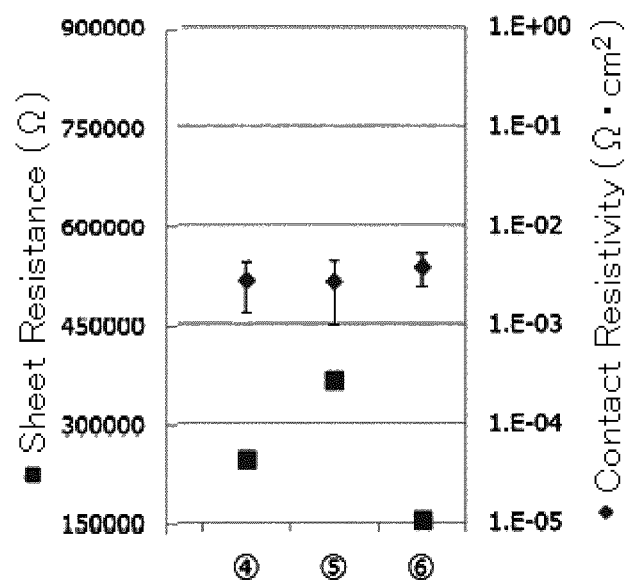
Figure 3F:
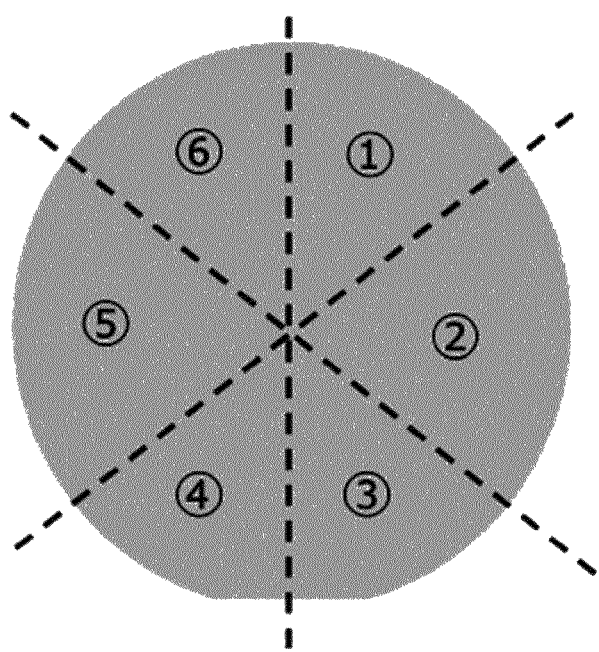
FIG. 3F is a simplified diagram of a semiconductor element featuring a nitride semiconductor layer that emits blue light, and a substrate used for comparison.

As shown in FIG. 3F, the substrate on which this LED structure was formed was divided into six regions 1 to 6, treatment on the surface of the p-side nitride semiconductor layer in the various regions was performed under different conditions, and the sheet resistance and the contact resistivity were measured in each region. The sheet resistance and contact resistivity here were measured using a Keithley model 2700 multimeter in accordance with the CTLM (circular transmission line model) method.

First, the results for regions 1 to 6 after dicing are shown in FIG. 3A. Sheet resistance and contact resistivity exhibited substantially constant values in every region of the wafer.

Plasma Treatment

After this, plasma treatment was performed in the regions 1 to 3. The plasma treatment was performed at an irradiation energy of 400 W using a plasma treatment apparatus (manufactured by Samco Corporation). This plasma treatment was carried out for 60 seconds, with the pressure inside the chamber set to 8 Pa, the oxygen gas flow rate to 100 sccm, and while applying bias power of 50 W in region 1, 200 W in the region 2, and 400 W in the region 3.

The sheet resistance and the contact resistivity of the p-side nitride semiconductor layers (regions 1 to 3) thus obtained were measured using the p-side electrode formed on the p-side nitride semiconductor layer. The results are shown in FIG. 3B.

The results shown in FIG. 3B confirmed that the sheet resistance did not change as a result of performing a plasma treatment (region 1) when the bias power was only 50 W, but with the increase along with an increase in bias power during the plasma treatment. On the other hand, the contact resistivity did not change as a result of performing a plasma treatment (region 1) when the bias power was only 50 W, but decreased when the bias power as the plasma treatment was increased to 200 W (region 2) and 400 W (region 3).

Heat Treatment after Plasma Treatment

The plasma-treated p-type nitride semiconductor layer in regions 1 to 3 were then heat treated in an oxygen-containing atmosphere. The heat treatment here was carried out for 10 minutes after raising the temperature to 540° C. in an atmosphere containing about 0.02% oxygen.

After this, the sheet resistance and contact resistivity of the p-type nitride semiconductor layer in regions 1 to 3 were measured. The results are shown in FIG. 3C.

The results in FIG. 3C confirmed that the sheet resistance did not change as a result of performing a plasma treatment (region 1) when the bias power was only 50 W, but the contact resistivity decreased. Also, when the bias power is fairly high as in regions 2 and 3, it was confirmed that performing a heat treatment increased both the sheet resistance and the contact resistivity to the point that they could no longer be measured.

Comparative Example: Heat Treatment after Electrode Formation

After electrode formation, the regions 4 to 6 were heat treated under the same conditions as those described above, but without performing a plasma treatment.

After this, the sheet resistance and the contact resistivity of the p-type nitride semiconductor layers in the regions 4 to 6 were measured. The results are shown in FIG. 3D.

The results in FIG. 3D confirmed that the sheet resistance did not change as a result of performing only a heat treatment, but the contact resistivity decreased slightly.

Comparative Example: Plasma Treatment after Heat Treatment

After heat treatment was performed in regions 4 and 5 under the same conditions as those described above, plasma treatment was performed in region 4 under the conditions described above for region 2 and in region 5 under the conditions described above for region 3.

After this, the sheet resistance and contact resistivity of the p-type nitride semiconductor layers in regions 4 and 5 were measured. The results are shown in FIG. 3E.

The results in FIG. 3E show that performing the plasma treatment after the heat treatment caused the sheet resistance to increase slightly as compared with region 6 in which only heat treatment was performed, but the contact resistivity barely changed.

These evaluation results confirmed that performing the heat treatment in an oxygen atmosphere after performing the plasma treatment markedly raises the resistance of the nitride semiconductor layer.

Evaluation Experiment 2: Measurement of Nitride Semiconductor Layer Surface by XPS The surface of the p-type nitride semiconductor layer was measured using XPS under a condition 1 in which the plasma treatment time was 30 seconds in region 1 in Evaluation Experiment 1, a condition 2 in which the plasma treatment time was 120 seconds in region 2 in Evaluation Experiment 1, and a condition 3 in which treatment was performed under the same conditions as in region 6 in Evaluation Experiment 1. The XPS analysis conditions are given below.

XPS Analysis Conditions
Device used: Quantera II scanning X-ray micro probe
X-ray source: monochromated Al Kα rays (hv 1486.6 eV)
Analysis area: 200 μm φ
Pass energy: 55 eV The 3d spectrum of gallium was measured, and the spectrum thus obtained was fitted to the 3d spectrum of gallium nitride and the 3d spectrum of gallium oxide.

In each condition, the surface area of the obtained spectrum is set as 100%, and the area ratio of the area of gallium nitride and the area of gallium oxide when fitted is shown in Table 1.

TABLE 1

| | Surface condition | | |
|---|---|---|---|
| | Condition 1 | Condition 2 | Condition 3 |
| Gallium nitride | 55.0% | 29.0% | 0% |
| Gallium oxide | 45.0% | 71.0% | 100% |

It was confirmed from the measurement results in Table 1 that the proportion of gallium oxide on the surface of the p-type nitride semiconductor layer is higher under conditions 2 and 3 than under condition 1. That is, it was confirmed that the surface of the nitride semiconductor layer subjected to a plasma treatment (conditions: 2 and 3) has more bonds between gallium and oxygen than the surface of the nitride semiconductor layer not subjected to a plasma treatment (condition 1). Also, when the bias power was set at 50 W (condition 2), the proportion of gallium oxide was 71.0%, whereas when the bias power was set at 200 W (condition 3), the proportion of gallium oxide was 100%.

From stated above, it was confirmed from the above that performing plasma treatment while applying bias power allows the proportion of gallium oxide on the surface of the p-type nitride semiconductor layer to be increased, that is, allows oxygen to be introduced to the surface of the p-type nitride semiconductor layer.

What is claimed is:

1. A method for manufacturing a semiconductor element, comprising:
   providing a nitride semiconductor layer;
   performing plasma treatment to at least part of a surface of the nitride semiconductor layer in an oxygen-containing atmosphere while applying bias power;
   after the performing of the plasma treatment, heat treating the nitride semiconductor layer in an oxygen-containing atmosphere;
   forming a protective film on a region of the surface of the nitride semiconductor layer where the plasma treatment was performed; and
   forming an electrode in a region of the surface of the nitride semiconductor layer where the protective film was not formed.

2. The method for manufacturing a semiconductor element according to claim 1, wherein
   the heat treating of the nitride semiconductor layer is conducted in an atmosphere having an oxygen content of 0.01% to 2.0%.

3. The method for manufacturing a semiconductor element according to claim 1, wherein
   the performing of the plasma treatment and the heat treating of the nitride semiconductor layer are conducted so that, after the heat treating, an area of the surface of the nitride semiconductor layer in which gallium and oxygen are bonded is larger in a region where the plasma treatment was performed than in a region that has not been subjected to the plasma treatment.

4. The method for manufacturing a semiconductor element according to claim 1, wherein
   the bias power is in a range of 50 W to 400 W.

5. The method for manufacturing a semiconductor element according to claim 1, wherein
   the heat treating of the nitride semiconductor layer is performed in a range of 350° C. to 500° C.

6. The method for manufacturing a semiconductor element according to claim 1, wherein the performing of the plasma treatment and the heat treating of the nitride semiconductor layer are conducted so that, after the heat treating, the surface of the nitride semiconductor layer includes a region in which gallium and oxygen are bonded and a region in which gallium and nitrogen are bonded, and in an area of the surface of the nitride semiconductor layer where the plasma treatment was performed and including the region where gallium and oxygen are bonded and the region where gallium and nitrogen are bonded on the surface of the nitride semiconductor layer, the region where gallium and oxygen are bonded accounts for at least 70%.

7. The method of manufacturing a semiconductor element according to claim 1, wherein the providing of the nitride semiconductor layer includes providing the nitride semiconductor on a substrate, and the performing of the plasma treatment includes covering a region of the surface of the nitride semiconductor layer not to be subjected to the plasma treatment with a mask, and then performing the plasma treatment to the at least part of the surface of the nitride semiconductor layer not covered by the mask.

8. The method of manufacturing a semiconductor element according to claim 1, further comprising:

providing a support member;

stacking the electrode and the protective film formed on the surface of the nitride semiconductor layer to the support member;

forming an additional electrode on a back surface of the nitride semiconductor layer;

forming an additional protective film over the support member and the additional electrode, part of the additional electrode being exposed from the additional protective film; and dicing the support member.

9. The method for manufacturing a semiconductor element according to claim 2, wherein the performing of the plasma treatment and the heat treating of the nitride semiconductor layer are conducted so that, after the heat treating, an area of the surface of the nitride semiconductor layer in which gallium and oxygen are bonded is larger in a region where the plasma treatment was performed than in a region that has not been subjected to the plasma treatment.

10. The method for manufacturing a semiconductor element according to claim 2, wherein the bias power is in a range of 50 W to 400 W.

11. The method for manufacturing a semiconductor element according to claim 2, wherein the heat treating of the nitride semiconductor layer is performed in a range of 350° C. to 500° C.

12. The method for manufacturing a semiconductor element according to claim 2, wherein the performing of the plasma treatment and the heat treating of the nitride semiconductor layer are conducted so that, after the heat treating, the surface of the nitride semiconductor layer includes a region in which gallium and oxygen are bonded and a region in which gallium and nitrogen are bonded, and in an area of the surface of the nitride semiconductor layer where the plasma treatment was performed and including the region where gallium and oxygen are bonded and the region where gallium and nitrogen are bonded on the surface of the nitride semiconductor layer, the region where gallium and oxygen are bonded accounts for at least 70%.

13. The method of manufacturing a semiconductor element according to claim 2, wherein the providing of the nitride semiconductor layer includes providing the nitride semiconductor on a substrate, and the performing of the plasma treatment includes covering a region of the surface of the nitride semiconductor layer not to be subjected to the plasma treatment with a mask, and then performing the plasma treatment to the at least part of the surface of the nitride semiconductor layer not covered by the mask.

14. The method for manufacturing a semiconductor element according to claim 3, wherein the bias power is in a range of 50 W to 400 W.

15. The method for manufacturing a semiconductor element according to claim 3, wherein the heat treating of the nitride semiconductor layer is performed in a range of 350° C. to 500° C.

16. The method for manufacturing a semiconductor element according to claim 3, wherein the performing of the plasma treatment and the heat treating of the nitride semiconductor layer are conducted so that, after the heat treating, the surface of the nitride semiconductor layer includes a region in which gallium and oxygen are bonded and a region in which gallium and nitrogen are bonded, and in an area of the surface of the nitride semiconductor layer where the plasma treatment was performed and including the region where gallium and oxygen are bonded and the region where gallium and nitrogen are bonded on the surface of the nitride semiconductor layer, the region where gallium and oxygen are bonded accounts for at least 70%.

17. The method of manufacturing a semiconductor element according to claim 3, wherein the providing of the nitride semiconductor layer includes providing the nitride semiconductor on a substrate, and the performing of the plasma treatment includes covering a region of the surface of the nitride semiconductor layer not to be subjected to the plasma treatment with a mask, and then performing the plasma treatment to the at least part of the surface of the nitride semiconductor layer not covered by the mask.

18. The method of manufacturing a semiconductor element according to claim 4, wherein the providing of the nitride semiconductor layer includes providing the nitride semiconductor on a substrate, and the performing of the plasma treatment includes covering a region of the surface of the nitride semiconductor layer not to be subjected to the plasma treatment with a mask, and then performing the plasma treatment to the at least part of the surface of the nitride semiconductor layer not covered by the mask.

* * * * *